United States Patent
Ismail et al.

[11] Patent Number: 5,923,952
[45] Date of Patent: Jul. 13, 1999

[54] FUSION-BOND ELECTRICAL FEED-THROUGH

[75] Inventors: M. Salleh Ismail; Raffi M. Garabedian, both of Moorpark, Calif.; Max E. Nielsen, Grace, Id.; Gary J. Pashby; Jeffrey K. K. Wong, both of Moorpark, Calif.

[73] Assignee: Kavlico Corporation, Moorpark, Calif.

[21] Appl. No.: 08/897,124

[22] Filed: Jul. 18, 1997

[51] Int. Cl.$^6$ .................................................. H01L 21/00
[52] U.S. Cl. .................................. 438/52; 438/48; 438/50
[58] Field of Search .................................. 438/52, 50, 48

[56] References Cited

U.S. PATENT DOCUMENTS

| | | | |
|---|---|---|---|
| 5,326,726 | 7/1994 | Tsang et al. | 438/52 |
| 5,476,819 | 12/1995 | Warren | 438/52 |
| 5,547,093 | 8/1996 | Sparks | 438/52 |
| 5,578,843 | 11/1996 | Garabedian et al. | |
| 5,656,512 | 8/1997 | Beitman | 438/52 |

Primary Examiner—Kevin M. Picardat
Assistant Examiner—Deven Collins
Attorney, Agent, or Firm—Skjerven, Morrill, MacPherson, Franklin & Friel; David T. Millers

[57] ABSTRACT

A semiconductor device has a flexible structure bonded to a semiconductor substructure to form a cavity. The flexible structure is bonded over a conducting feed-through without the feed-through interfering with a hermetic seal formed by bonding. One embodiment of the device includes depressions that contain edges of a diffused feed-through so that imperfections at the edge of the diffusion do not interfere with bonding. The flexible structure is bonded to elevated areas thus hiding the imperfections. In one embodiment, a first elevated region is surrounded by a second elevated region, and diffusion for the feed-through extends from an active region in the cavity across the first elevated region with edges of the diffusion being between the first and second elevated regions. The flexible structure can thus bond to the first and second elevated regions without interference from the edge of the diffused feed-through. A via through the flexible structure to the first elevated region provides electrical contact with the active region. Another embodiment has either a surface or buried well in a semiconductor structure and extending from an active region in the cavity to a point outside the perimeter of the flexible structure. The well provides a conductive feed-through structure without creating imperfections that would interfere with the bonding that seals the cavity.

19 Claims, 7 Drawing Sheets

FUSION-BOND ELECTRICAL FEED-THROUGH

FIELD OF THE INVENTION

This invention relates generally to semiconductor devices and more particularly, to semiconductor devices having a feed-through structure.

RELATED ART

Single Crystal Surface Micromachining (SCSM) shapes a silicon wafer for fusion bonding during building of semiconductor structures such as field effect transistors (FETs) and capacitors having flexible membranes. Such structures can operate as miniature pressure sensors or accelerometers and are integrable with standard MOS (metal oxide semiconductor) devices. For example, if an FET with a flexible gate structure has its gate and drain coupled together, the drain-source voltage of the FET depends on the mechanical deflection of the gate structure. U.S. Pat. No. 5,578,843 describes fabrication of such sensors and is incorporated by reference herein in its entirety.

A critical process in SCSM is Silicon Fusion Bonding (SFB), where a semiconductor grade silicon wafer is fused to the surface of another patterned and structured silicon substrate. The top wafer is then thinned and patterned to form flexible structures on the patterned substrate. The flexible microstructures are typically diaphragms, bridges, and beams. In typical applications of this technology, the flexible microstructures which convert mechanical forces into electrical signals and the actuators convert electrical signals into mechanical forces. In either case, active electrical structures, such as capacitive plates, are formed in the semiconductor substrate under the flexible structure.

A major problem with the SFB process is associated with providing electrical continuity from the active regions under the flexible structures to contacts or circuitry away from the flexible structures. The flatness and smoothness of the two bonding surfaces are critical for successful silicon fusion bonding. Almost all processes used in semiconductor manufacturing for creation of conductive regions (such as feed-throughs) form steps, bumps, or imperfections on the wafer's surface which impedes successful silicon fusion bonding.

FIGS. 1A and 1B show a portion of a prior art semiconductor device having a flexible diaphragm over a cavity formed between the flexible diaphragm and the surface of a semiconductor substrate. For purposes of illustration, the semiconductor device shown in FIGS. 1A and 1B is one form of a SCSM pressure sensor and will be described with the understanding that the principles shown and discussed in reference to a pressure sensor 100 shown in FIGS. 1A and 1B are applicable to other types of structures that utilize a flexible structure. Pressure sensor structure 100 is formed on a semiconductor substrate 102. An elevated bonding ring 104 is formed on the surface of semiconductor substrate 102. A sensor plate 106 is formed in the surface of semiconductor substrate 102 within the elevated bonding ring 104. Sensor plate 106 can be formed by several methods, e.g., ion implantation of dopant to make sensor plate 106 highly conducting. Sensor plate 106, if it is a capacitive structure, serves as one plate of the capacitor and a flexible diaphragm 108 serves as the other capacitor plate. Flexible diaphragm 108 is manufactured from a second semiconductor substrate material and is fusion bonded to the elevated surfaces, forming fusion bonding regions 110 of bonding ring 104. The bonding of flexible diaphragm 108 onto bonding ring 104 creates a cavity 112 over sensor plate 106. Typically, in such structures the sensor plate must be electrically connected to other structures formed in other parts of semiconductor substrate 102. This is accomplished by forming feed-through structures such as feed-through 114. As discussed above, a major problem with the SFB process is that it is necessary that the two surfaces to be fusion bonded are very flat and smooth to obtain successful bonding. As noted above, almost every process used in semiconductor manufacturing for the creation of conductive regions, such as feed-through 114, forms steps, bumps, or imperfections in area 118 on the surface of bonding ring 104 in FIG. 1B. For sensor device 100 to function as a capacitive pressure sensor, cavity 112 under diaphragm 108 must contain a vacuum or a fixed pressure. Therefore, as the pressure on a top surface 120 of diaphragm 108 changes, so does the gap between diaphragm 108 and sensor plate 106 and hence the capacitive coupling between the two plates. The electronics formed outside the vacuum cavity, or on a separate substrate, converts the change in capacitance into a desired electronic signal. This indicates the importance that area 118 of feed-through 114 not have any bumps, ridges, or imperfections so that a hermetic seal between the vacuum cavity and the outside is maintained. The criticality of the smoothness is illustrated by the fact that a 50 Å high defect on the bonding surface can impede fusion bonding and cause a failure of a hermetic seal of cavity 112 in the final structure.

One solution to the problem of surface degradation when forming electrical feed-throughs is to diffuse conductors in the bonding region before the silicon fusion bonding process. Diffusion by a solid or gaseous source can form the conductive feed-throughs without creating unacceptable bumps. See Dudaiceus et al., "Surface Micromachined Pressure Sensors with Integrated CMOS Read-Out Electronics," *Sensors and Actuators A*, Vol. 43, 1994, pp. 157–163, which is hereby incorporated herein by reference in its entirety. However, the diffusion process is not compatible with the polysilicon aligned gate process used in standard CMOS integrated circuit fabrication. Process compatibility is highly desirable as it allows the integration of high density circuitry on the sensor substrate which improves system performance and lowers manufacturing cost.

The preferred method of producing doped regions in CMOS processes is ion implantation. In a typical process flow, deposited polysilicon masks the implant. However, this is problematic in forming feed-throughs because the polysilicon must then be removed from the high plane to allow fusion bonding. The problem occurs because all known polysilicon etches damage the underlying silicon dioxide layer to a degree that detrimentally impacts the silicon fusion bonding process and hence reduces the yield of good devices and the subsequent reliability of devices that pass initial testing. The oxide cannot at this point in the process be stripped and re-grown because differential oxidation will result in thicker oxide over the doped region.

FIGS. 2A–2C illustrate the problems associated with ion implantation methods using polysilicon to mask the nonimplant areas. A device 200 to be manufactured starts with a semiconductor substrate 202 with an oxide layer 204 formed on the surface of semiconductor substrate 202. A polysilicon mask 206 is selectively formed on the surface of oxide layer 204, and dopant ions are implanted. As an example, FIG. 2A shows phosphorus ions, indicated by arrows 208, being implanted at an energy level of greater than 60 keV (thousand electron-volts) into the device. The implanted phosphorous ions form an n+ region 210 (FIGS. 2B and 2C). FIG. 2B illustrates etching 212 to remove polysilicon mask 206, and FIG. 2C shows the resulting oxide layer structure having differential heights 214 caused by exposing oxide over region 210 to etch 212.

FIGS. 3A and 3B illustrate the problems associated with ion implantation methods using photoresist to mask the nonimplant areas. In contrast to the removal of polysilicon, the removal of the photoresist does not attack the underlying oxide or silicon. But implantation of heavy ions such as arsenic or phosphorus through a photoresist mask to create an n+ conductor creates ridges at the photoresist edge that can be hundreds of angstroms in height which will detrimentally affect successful silicon fusion bonding. Although other dopants, such as boron, can be implanted to form p+ conductors, both implant types are required to form "channel-stop" regions and guard electrodes. For this reason, photoresist masking alone is not an effective solution for forming feed-throughs. FIG. 3A shows a portion of a semiconductor device 300, a semiconductor substrate 302, an oxide layer 304, and a patterned photoresist layer 306. Phosphorus ions 308 are implanted into the surface of semiconductor substrate 302, to form a high conductivity region. Implantation of ions is well known in the art and will not be discussed in detail. FIG. 3B shows a conductive region 310 and bumps 312 formed by the ion implantation, on the surface of oxide layer 304 and in silicon substrate 302. The outline of the removed photoresist layer is shown by dashed line 314 to indicate where the bumps form in relation to photoresist layer 306.

Accordingly, methods and devices are needed that avoid the detrimental effects of the bumps and oxide damage caused by the various methods of forming high conductivity feed-throughs in the surface of a semiconductor substrate.

SUMMARY

A semiconductor device having a flexible structure over a sealed cavity has a conducting feed-through extending from an active region in the cavity to a point outside the cavity for connection to external circuitry. Embodiments of the invention provide semiconductor devices and methods form making semiconductor devices that avoid flaws in the cavity's seal caused by the feed-through crossing a bond that forms the seal. One such device has a flexible structure bonded to an elevated area of a semiconductor structure. The device includes depressed regions that contain edges of a difflusion feed-through structure so that imperfections at the edge of the diffusion structure do not interfere with bonding. In one specific embodiment, a first elevated region is surrounded by a second elevated region, and diffusion for the feed-through structure extends from an active region in the cavity across the first elevated region with edges of the difflusion being between the first elevated region and the second elevated region. The flexible structure can thus bond to the first and second elevated regions without interference from the edges of the diffused feed-through. A via through the flexible structure to the first elevated region provides electrical contact to the feed-through and through the feed-through to the active region.

Another embodiment has either a surface well or a buried well in a semiconductor structure and extending from an active region in a cavity to a point outside the perimeter of a flexible structure. A buried well may be formed, for example, in a semiconductor substrate and covered with an epitaxial layer. The conducting feed-through is then form by second well extending from an active region in the cavity through the epitaxial layer to the first well, across the first well to a location outside the perimeter of the flexible structure, and up through a third well to the surface of the epitaxial layer. The first well provides a conductive feed-through structure under a bonding area without creating imperfections that would interfere with the bonding that seals the cavity containing the active region.

BRIEF DESCRIPTION OF THE DRAWINGS

Use of the same reference symbols in different figures indicates similar or identical items.

DETAILED DESCRIPTION

Figure 1A:
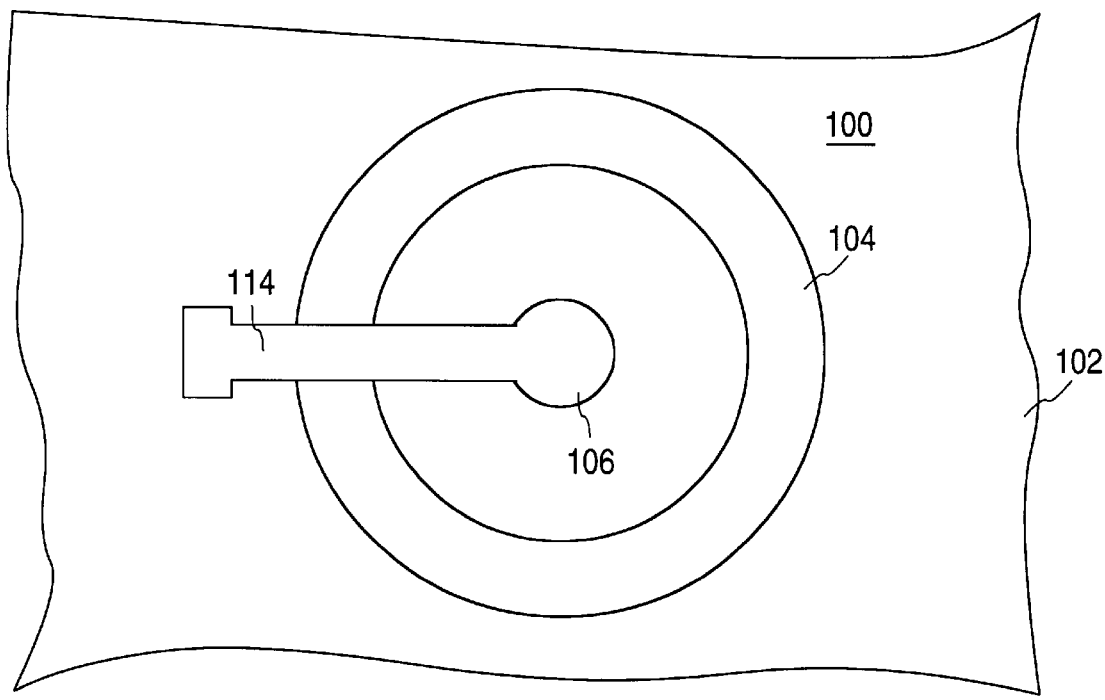
FIGS. 1A and 1B show a prior art semiconductor device having a flexible diaphragm over a cavity formed between the flexible diaphragm and the surface of a semiconductor substrate.
Figure 1B:
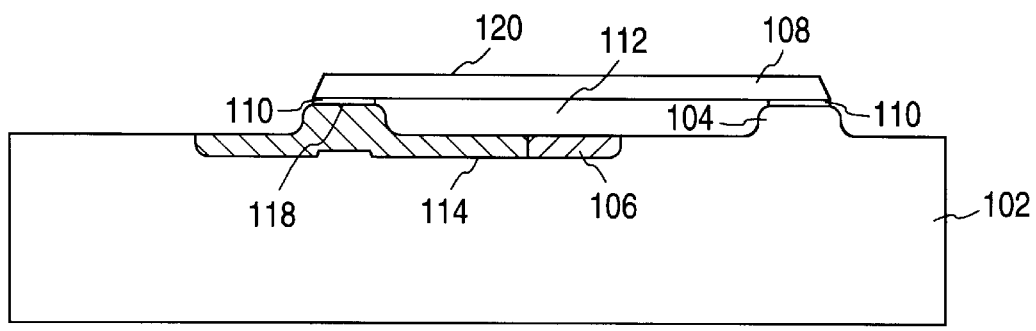
Figure 2A:
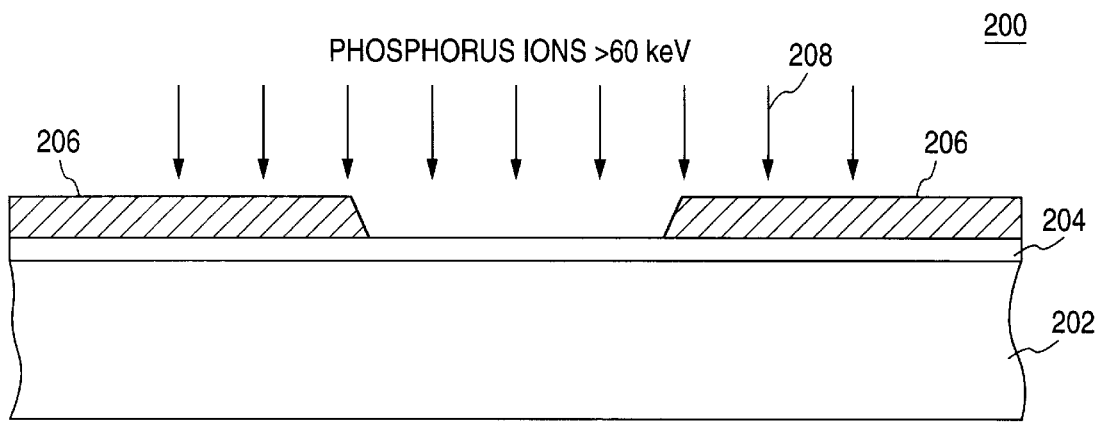
FIGS. 2A, 2B, and 2C illustrate the problems associated with ion implantation methods using polysilicon to mask the nonimplant areas.
Figure 2B:
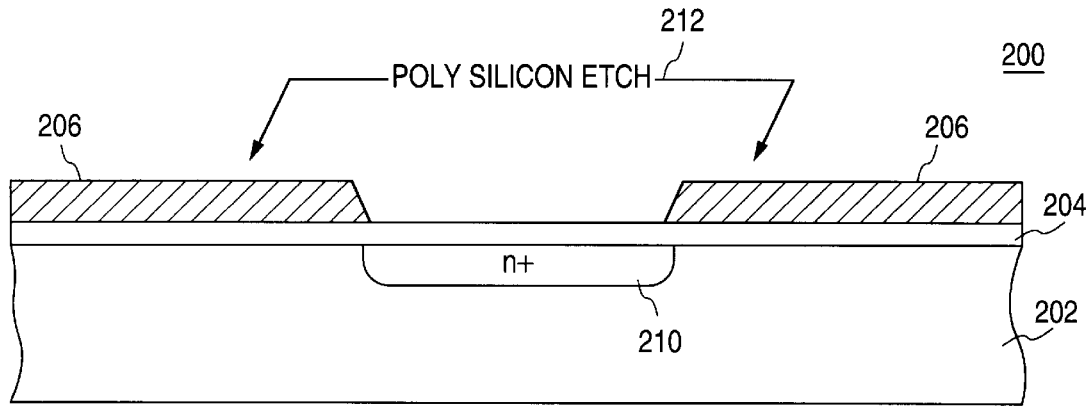
Figure 2C:
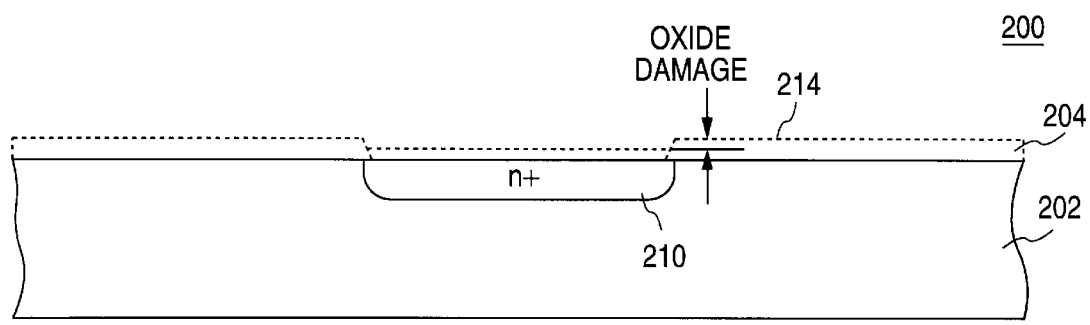
Figure 3A:
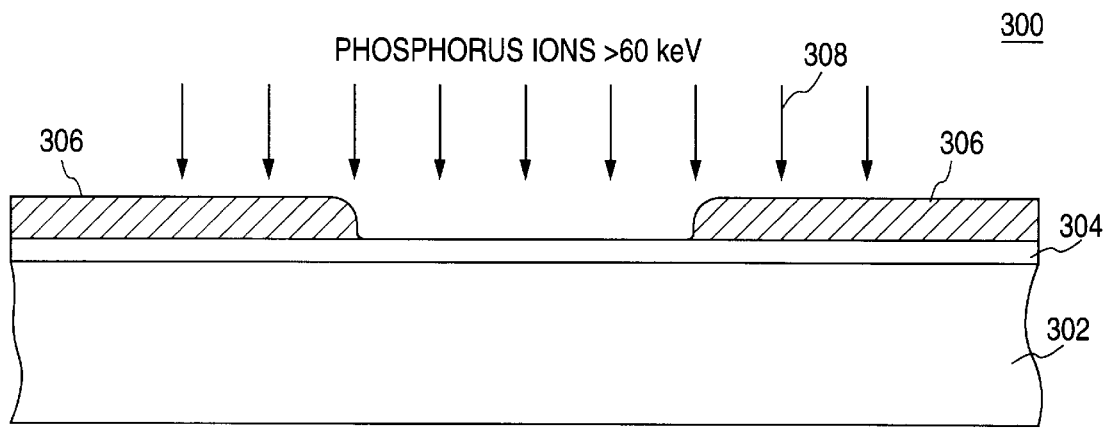
FIGS. 3A and 3B illustrate the problems associated with ion implantation methods using photoresist to mask the nonimplant areas.
Figure 3B:
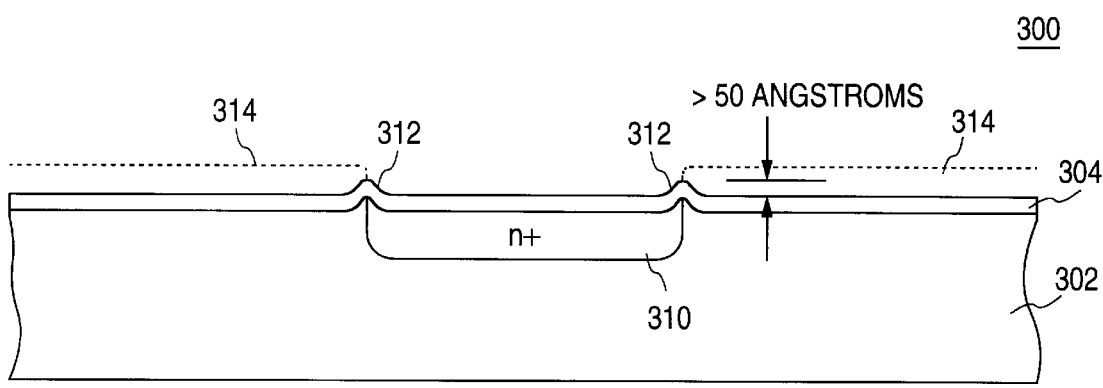
Figure 4A:
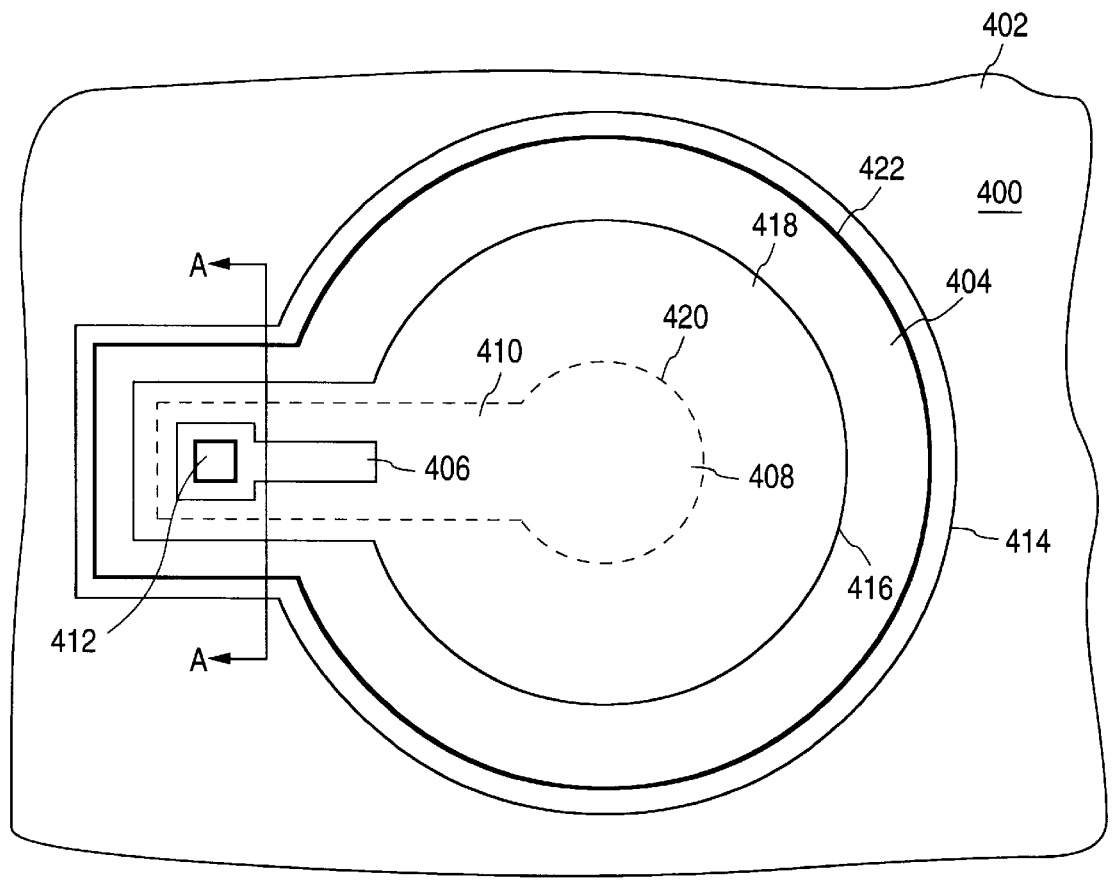
FIG. 4A shows a semiconductor device in accordance with an embodiment of the invention having a flexible diaphragm over a cavity formed between the flexible diaphragm and the surface of a semiconductor substrate.

FIG. 4A shows a semiconductor device 400 in accordance with an embodiment of the invention. Device 400 is a capacitive sensor having a flexible plate structure similar to the device shown in FIG. 1A. Device 400 is formed in and on a substrate 402 that is contoured to form an elevated bond area including an outer bond plane 404 and an inner bond plane 406. Outer bond plane 404 is a raised portion of substrate 402 having an outer boundary 414 and an inner boundary 416. Inner bond plane 406 is inside inner boundary 416 of outer bond plane 404. A diaphragm (or other flexible structure) 440 having an outer boundary is bonded to bond planes 404 and 406 and has an opening exposing a portion 412 of inner bond plane 406. The bond between diaphragm 440 and bond plane 406 prevents leakage between the sealed cavity and the opening through diaphragm 440.

Also inside boundary 416 is a lower plane area 418 of substrate 402 for active regions of device 400. Before fusion bonding, difflusion in area 418 forms a sensor plate 408 for capacitive sensor 400. In alternative embodiments of the invention, area 418 includes active regions such as source, drain, and channel regions for a MOGFET (moving gate field-effect transistor) having diaphragm 440 as a gate. A feed-through region 410 extends from sensor plate 408 (or other active regions) to area 412 on inner bond plane 406. Area 412 is, for example, a contact for via through diaphragm 440 to allow electrical connection to other portions of the semiconductor device. Formation of sensor plate 408 and feed-through region 410 creates a bump or damaged area in substrate 402 at edges 420 of the diffused region. This bump or damage if present on bond plane 404 or 406 could interfere with fusion bonding and formation of a hermetically sealed cavity enclosed by diaphragm 440 and elevated bond planes 404 and 406. Accordingly, edges 420 of difflusion regions 408 and 410 are in depressed area 418.

Figure 4B:
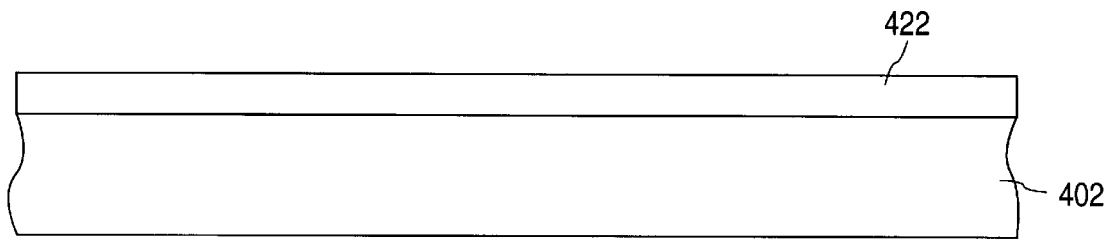
FIGS. 4B, 4C, 4D, 4E, and 4F illustrate a method for forming a device with a feed-through in accordance with an embodiment of the invention.
Figure 4C:
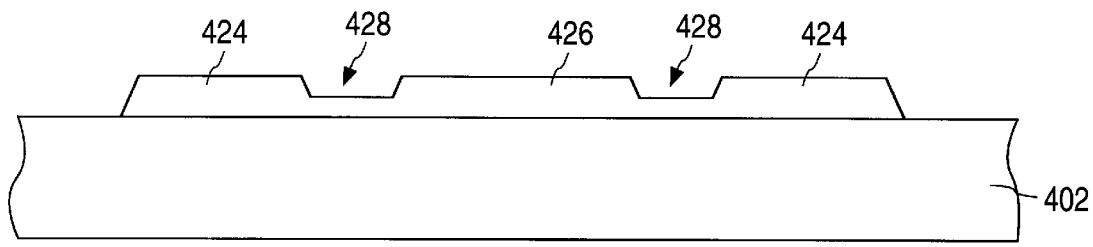
Figure 4D:
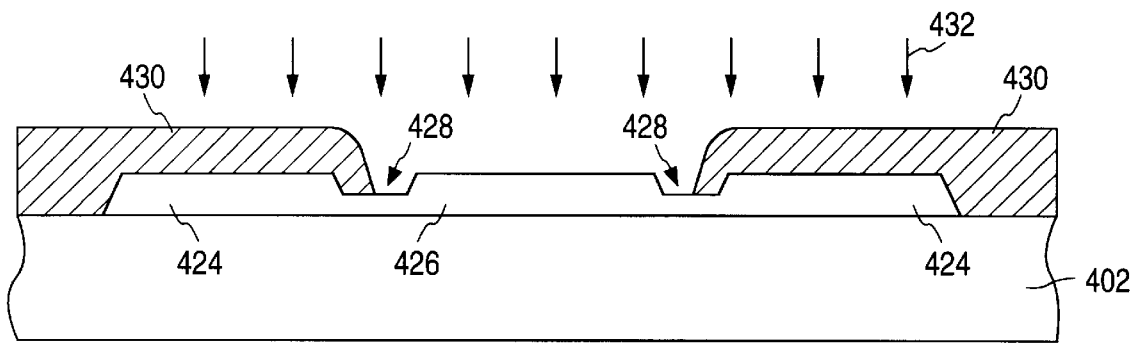
Figure 4E:
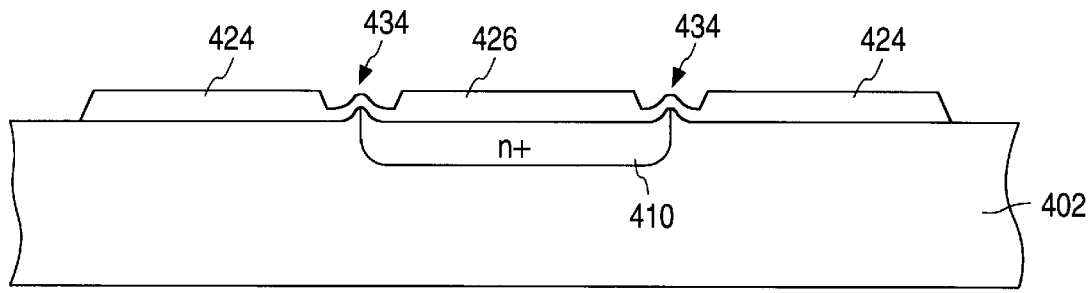
Figure 4F:
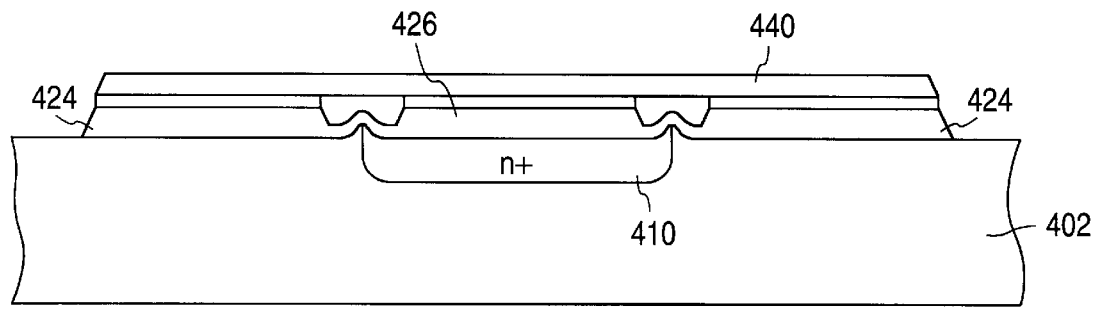

FIGS. 4B–4F show a series of fabrication steps for the cross-section through line AA in FIG. 4A and illustrate how to prevent the ion implantation damage from interfering with bonding. FIG. 4B shows a silicon dioxide (oxide) layer 422 about 500 to 700 Å thick formed on substrate 402 in the area of bond planes 404 and 406. Substrate 402 as illustrated has a flat upper surface but alternatively may be contour to form or partially form bond planes 404 and 406. FIG. 4C shows depressions 428 formed about 250 Å deep in the oxide layer 422 over regions of substrate 402 where subsequent processing steps will form edges 420 of diffused region 410. Thicker portions 424 and 426 of oxide layer 422 form or overlie elevated bond planes 404 and 406 respectively. Depressions 428 can be formed by various methods including selective etching of oxide layer 424 in depressions 428, using well known LOCOS (localized oxidation of silicon) to grow oxide (i.e., increase the thickness of) oxide layer 422 surrounding depressions 428, or shaping of substrate 402 prior to formation of oxide layer 424 so that oxide layer 422 following the contour of substrate 402 forms depressions 428. FIG. 4D shows a photoresist mask 430 formed on selected portions of oxide layer 422 for formation of difflused feed-through region 410. Mask 430 is patterned to extend into depression 428 and place edges 420 of diffused region 410 in depressions 428. After mask 430 is formed, an ion implantation 432 through the exposed portion of oxide layer 422 forms region 410 in substrate 402. FIG. 4E shows mask 430 removed and region 410 with bumps 434 at edge 420 in depressions 428. FIG. 4F shows diaphragm 440 bonded to areas 424 and 426 of oxide layer 422 over bond planes 404 and 406. The bond between diaphragm 440 and oxide 422 at bond plane 424 hermetically seals the outer perimeter of the cavity. The bond between diaphragm 440 and inner plane 406 forms a hermetic seal that prevents leakage through via 412. A patterned metal layer extending over part of diaphragm 440 can connect via 412 to external circuitry.

Figure 5A:
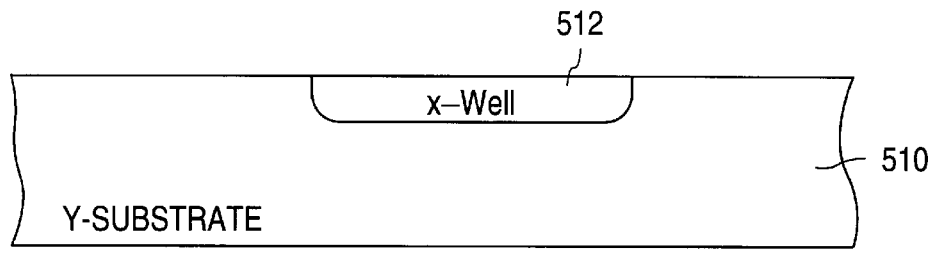
FIGS. 5A, 5B, 5C, 5D, and 5E illustrate a method of forming a device and feed-through in accordance with another embodiment of the invention.
Figure 5B:
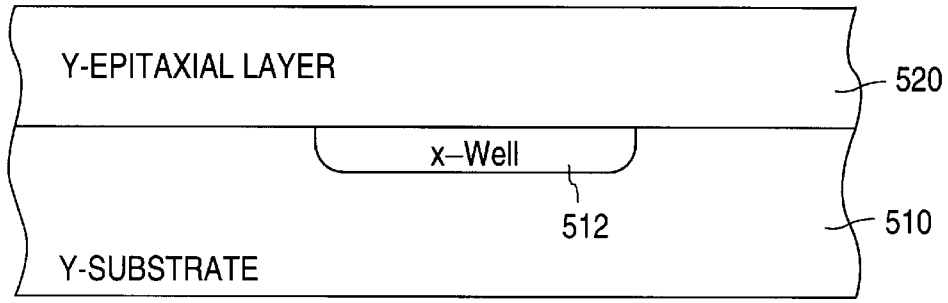
Figure 5C:
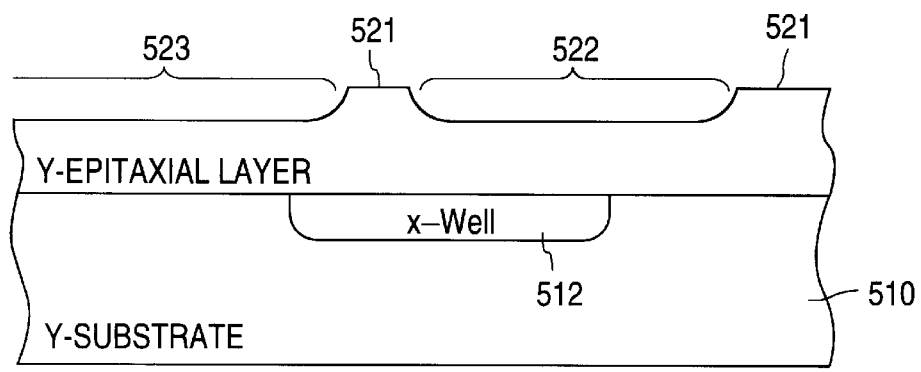
Figure 5D:
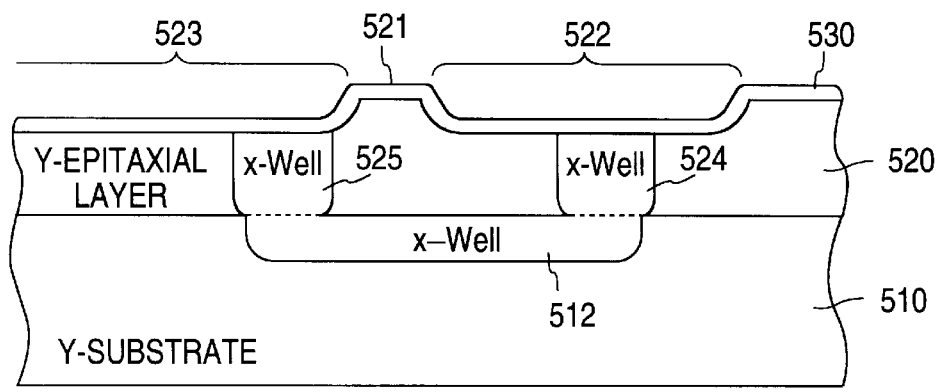

FIGS. 5A to 5E illustrate a process for forming a device 500 (FIG. SE) having a hermetically sealed cavity 542 and a feed-through structure for electrical connection to an active region 526 in walls of cavity 542. FIG. 5A shows initial fabrication process steps that form a conductive well 512 of conductivity type x (where x is p or n) to a depth of about 1 to 2 μm in a substrate 510 having the opposite conductivity type y. An epitaxial layer 520 of the same conductivity type as substrate 510 is then formed on substrate 510 overlying well 512 as illustrated in FIG. 5B. Epitaxial layer 520 is shaped as shown in FIG. 5C to form depressed areas 522 and 523 and leave an elevated area 521 for bonding of a flexible diaphragm that will seal area 522 inside the sensor cavity. Area 523 is for circuitry outside the sensor cavity. As shown in FIG. 5D, conductive well 512 has a portion underlying area 522 and a portion underlying area 523 so that conductive wells 524 and 525 of the same conductivity type as well 512 form conductive paths from respective areas 522 and 523 to buried well 512. FIG. 5D also shows an oxide layer 530 formed on epitaxial layer 520. Oxide layer 530 reduces damage cause by ion implantation to form wells 524 and 525 and also facilitates subsequent fusion bonding of a diaphragm 540 to elevated area 521.

Figure 5E:
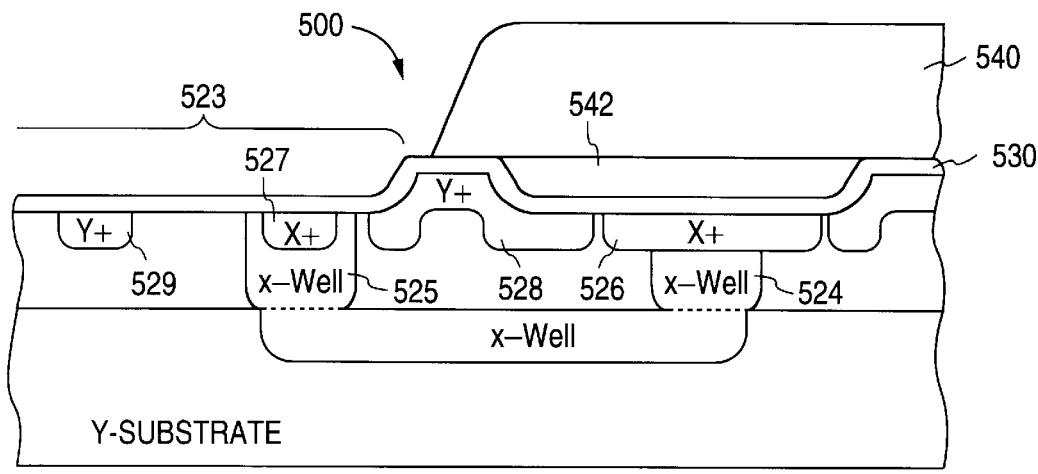

As shown in FIG. 5E, doping with x type dopants forms an active region 526 in area 522 in contact with well 524 and a contact region 527 in area 523 in contact with well 525. Active region 526 forms the fixed plate for a capacitive sensor, but alternative embodiments include devices with active regions for other types of devices such as a MOGFET. Contact region 527 is for connection to circuitry in area 524. Known fabrication processes form x-type and y-type regions such as region 529 as required for fabrication of CMOS devices in area 523. Y+ regions 528 are formed in elevated areas 521 nearest diaphragm 540 to avoid ion segregation and to reduce parasitic capacitance between diaphragm 540 and the adjacent portion of the underlying semiconductor structure. After formation of active regions, diaphragm 540 is fusion bonded to elevated areas 521 sealing cavity 542.

Figure 6:
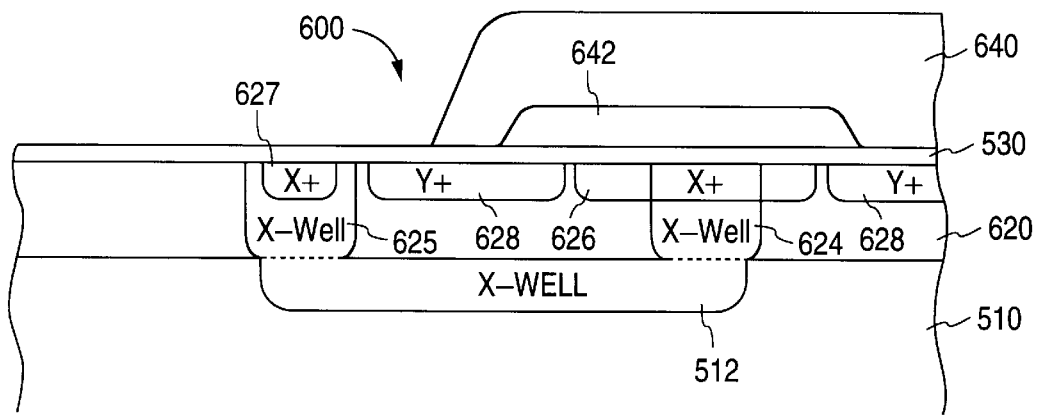
FIGS. 6 and 7 show alternative devices and feed-through structures in accordance with the invention.

The process of FIGS. 5A to 5E can be varied in a number of ways for alternative embodiments of the invention. For example, a device 600 as shown in FIG. 6 has an epitaxial layer 620 formed on substrate 510; but instead of shaping epitaxial layer 620 to form a cavity as in device 500, a depression in a wafer 640 aligned bonded to epitaxial layer 620 forms a sensor cavity 642 for device 600. The aligned fusion bonding aligns wafer 640 and cavity 642 with the active regions formed in epitaxial layer 620. Otherwise the fabrication process for device 600 is similar to the process disclosed above in reference to FIGS. 5A to 5E. In particular, a feed-through structure for device 600 includes a well 624 that connects active region 626 in cavity 642 to buried well 512 in substrate 510 and a well 625 that connects buried well 512 to a contact 627 to circuitry formed outside cavity 642.

Figure 7:
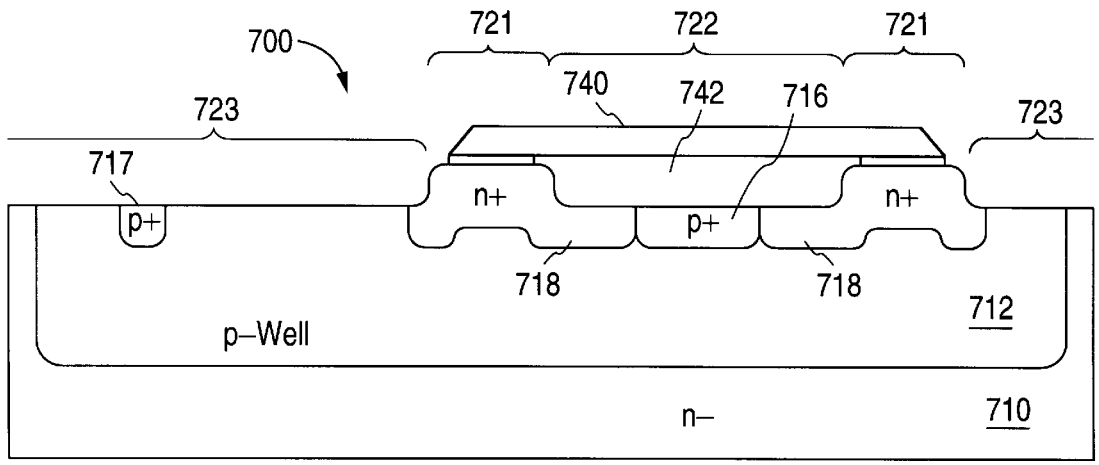

FIG. 7 shows a device 700 with another alternative conductive feed-through structure. In FIG. 7, a p-well 712 is formed in an n-substrate 710. (The n and p conductivity types of course can be reversed.) Well 712 unlike well 512 of FIG. 5E is not buried. Substrate 710 is shaped, for example, by LOCOS micromachining to form depress areas 722 and 723 and an elevated area 721. A p+ sensor plate 716 is formed in area 722 in contact with p-well 712, and n+ regions 718 are formed on around sensor plate 716 in substrate 710 including elevated area 721. N+ regions 718 by separating diaphragm 740 from the feed-through conductor (p-well 712) reduces fixed parasitic capacitor in sensor 700 when compared to devices having feed-through conductors that cross elevated areas and are therefore closer to the flexible plate structure. The n+ implant to form region 718 keeps bond area 721 without bumps or imperfections if the edges of region 718 do not cross elevated area 721. P-well 712 provides a feed-through conductor from sensor plate 716 to a p+ contact area 717 for connection of sensor plate 716 to external circuitry (not shown) in area 723.

Although the invention has been described with reference to particular embodiments, the description is only an example of the invention's application and should not be taken as a limitation. Various other adaptations and combinations of features of the embodiments disclosed are within the scope of the invention as defined by the following claims.

We claim:

1. A method of making a semiconductor device comprising:

shaping a semiconductor structure to form a first elevated area, a second elevated area surrounding the first elevated area, and a depression in between the first and second elevated areas;

forming a mask over the semiconductor structure, wherein the mask has an edge in the depression;

implanting dopants in the semiconductor structure to form a conductive region covering the first elevated area, wherein edges of the conductive region are in the depression and surrounding the first elevated area;

bonding a structure on the first and second elevated areas of the semiconductor structure such that a sealed cavity is formed over the depression containing the edges of the conductive region; and forming a contact through the structure to the first elevated area.

2. The method of claim 1, wherein the elevated area of the semiconductor structure comprises an oxide layer, and forming the depression comprises forming a depression in the oxide layer.

3. The method of claim 1, wherein implanting ions forms imperfections in the depression, and being in the depression prevents the imperfections from interfering with bonding of the wafer.

4. The method of claim 3, wherein the depression has a depth greater than a height of the imperfections.

5. The method of claim 1, wherein the conductive region extends to active regions in the depression.

6. A method of making a semiconductor device, comprising:

forming a first well in a semiconductor structure;

forming an active region that is in the semiconductor structure and in electrical contact with the first well;

bonding a structure to the semiconductor structure to form a sealed cavity containing the active region, wherein the first well extends to a point outside a perimeter of the structure; and electrically connecting circuitry to the active region via the first well.

7. The method of claim 6, wherein the first well and the active region are of the same conductivity type.

8. The method of claim 6, further comprising:

forming an epitaxial layer overlying the first well, wherein the active region is formed in the epitaxial layer; and forming a second well extending from the active region through the epitaxial layer to the first well.

9. The method of claim 8, further comprising forming a third well outside the perimeter of the structure, wherein the third well extends through the epitaxial layer to the first well, wherein connecting circuitry to the active region comprises connecting the circuitry to the active region via a conductive path through the third, first, and second wells.

10. The method of claim 9, wherein the first, second, and third wells are of a first conductivity type, the first well is formed in a substrate, and the substrate and the epitaxial layer are of a second conductivity type.

11. The method of claim 6, further comprising shaping the semiconductor structure to form an elevated area surrounding an area containing the active region, wherein bonding the structure comprises bonding the structure to the elevated area.

12. The method of claim 6, wherein the structure comprises a wafer having a depression formed therein, and bonding the structure comprises aligned bonding the wafer to the semiconductor structure so that the depression overlies the active region.

13. The method of claim 6, wherein forming the active region comprises forming the active region in the first well.

14. The method of claim 6, wherein bonding comprises fusion bonding.

15. A method of making a semiconductor device, comprising:

forming a first well in a substrate, the first well having a first conductivity type and the substrate having a second conductivity type;

forming an epitaxial layer on the substrate and the first well, the epitaxial layer having the second conductivity type;

forming a second well in the epitaxial layer, the second well communicating with the first well and having the first conductivity type;

forming an active region in the epitaxial layer, the active region communicating with the second well and having the first conductivity type; and bonding a structure on the epitaxial layer to form a sealed cavity containing the active region, wherein the first well extends to a point outside a perimeter of the structure.

16. The method of claim 15, further comprising forming a third well in the epitaxial layer and outside the perimeter of the structure, wherein the third well communicates with the first well and has the first conductivity type.

17. The method of claim 15, further comprising forming an elevated area surrounding an area containing the active region, wherein bonding the structure comprises bonding the structure to the elevated area.

18. The method of claim 15, wherein the structure comprises a depression formed therein, and bonding the structure comprises aligned boding the structure on the epitaxial layer such that the depression overlies the active region.

19. The method of claim 15, additionally comprising connecting circuitry to the third well to form a conductive path to the active region.

\* \* \* \* \*

UNITED STATES PATENT AND TRADEMARK OFFICE
CERTIFICATE OF CORRECTION

PATENT NO. : 5,923,952
DATED : July 13, 1999
INVENTOR(S) : Ismail et al.

It is certified that error appears in the above-identified patent and that said Letters Patent is hereby corrected as shown below:

Title page,
Item [54], title, please delete "FUSION-BOND ELECTRICAL FEED-THROUGH" and substitute -- PROCESS FOR MAKING A FUSION-BONDED SEMICONDUCTOR DEVICE HAVING AN ELECTRICAL FEED-THROUGH --;

Column 1,
Line 29, delete "which"; and

Column 5,
Line 41, delete "SE" and substitute -- 5E --.

Signed and Sealed this

Fourteenth Day of May, 2002

*Attest:*

JAMES E. ROGAN
*Attesting Officer*  *Director of the United States Patent and Trademark Office*